United States Patent [19]

Ishibashi et al.

[11] Patent Number: 5,029,300
[45] Date of Patent: Jul. 2, 1991

[54] METAL DETECTOR PROTECTED FROM MALFUNCTION CAUSED BY RADIO WAVES

[75] Inventors: Keisuke Ishibashi, Nagaokakyo; Hidetoshi Matsumoto, Kyoto, both of Japan

[73] Assignee: Omrom Corporation, Kyoto, Japan

[21] Appl. No.: 541,332

[22] Filed: Jun. 21, 1990

[30] Foreign Application Priority Data

Jun. 21, 1989 [JP] Japan .................................. 1-158818
Apr. 11, 1990 [JP] Japan .................................. 2-96789

[51] Int. Cl.$^5$ ............................ G01V 3/11; H03B 5/12
[52] U.S. Cl. ...................................... 331/65; 324/327; 324/236; 331/117 R
[58] Field of Search ............ 331/65, 117 R; 324/222, 324/236, 327; 328/5; 340/941, 551, 552, 561, 568

[56] References Cited

U.S. PATENT DOCUMENTS

4,644,298  2/1987  Kamiya et al. ........................ 331/65
4,761,603  8/1988  Nodera ............................. 331/65 X
4,803,444  2/1989  Takahashi ............................ 331/65

Primary Examiner—Siegfried H. Grimm
Attorney, Agent, or Firm—Dickstein, Shapiro & Morin

[57] ABSTRACT

A sensor according to this invention comprises an oscillation circuit including an LC resonant circuit, wherein a detection signal is prohibited upon arrival of an external radio wave.

11 Claims, 11 Drawing Sheets

1 — detection circuit
6 — LC resonant circuit

40 ---- Comparison circuit
TR 10 --- Substrate type PNP transistor

(a) TR 10 emitter voltage (b) Comparison circuit 40 output

Fig. 19

(a) TR 10 emitter voltage (b) Comparison circuit 40 output

Fig. 20

(a) TR 10 emitter voltage (b) Comparison circuit 40 output

METAL DETECTOR PROTECTED FROM MALFUNCTION CAUSED BY RADIO WAVES

BACKGROUND OF THE INVENTION

1. Field of Invention

This invention relates to a sensor which detects approaching metal without actually contacting the metal. More specifically, this invention relates to an oscillation circuit including an LC resonant circuit that serves as a detection circuit.

2. Related Art

The sensor of this invention can be installed, for example, in a pachinko machine. When a pachinko ball goes through a payoff hole, the sensor detects the passage and, accordingly, the machine pays off a certain amount of balls to an operator. A conventional sensor is an induction type sensor. When metal approaches an induction coil of a conventional sensor, an eddy current is induced in the metal and resistance is raised in the coil. Consequently, the metal is detected.

Other sensors used for detecting the existence of pachinko balls are a contact type and an optical type. The contact type consists of a movable lever which is movably displaced by the passage of the pachinko ball. When the lever is fully displaced it contacts a contact and the machine is signaled that a ball has passed. The lever is biased in an off, or closed, position and only makes contact, assuming an on state, when a ball passes. However, such contact type sensors have drawbacks in that chattering occurs, potentially causing miscount of the actual number of balls passing through the opening. The optical sensor detects the pachinko ball when it passes through a beam emitted from a light emitting device. When the ball passes through the beam, a phototransistor does not receive the emitted light and detection is indicated. However, optical sensors have drawbacks in that "noise" interferes with the count.

Thus, induction type sensors are usually implemented in pachinko machines, avoiding the drawbacks of contact and optical sensors. Specifically, induction sensors are subjected to a reduced effect from outside "noise" and have a prolonged life because they can detect the ball without actually contacting it.

Figure 9:
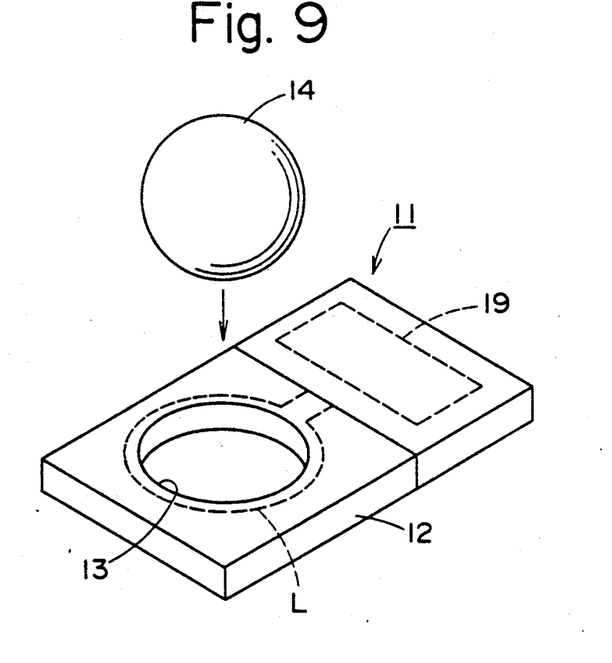
FIG. 9 is a perspective view illustrating the appearance of an induction type sensor.

FIG. 9 illustrates the general appearance of an induction type pachinko ball sensor 11. When a pachinko ball 14 goes through a detection hole 13 in casing 12, which is made from synthetic resin, the energy of a coil L incorporated in the casing 12 and surrounding the hole 13 is changed and a detection circuit 19, also inside the casing 12, detects the passage of the ball 14.

Figure 10:
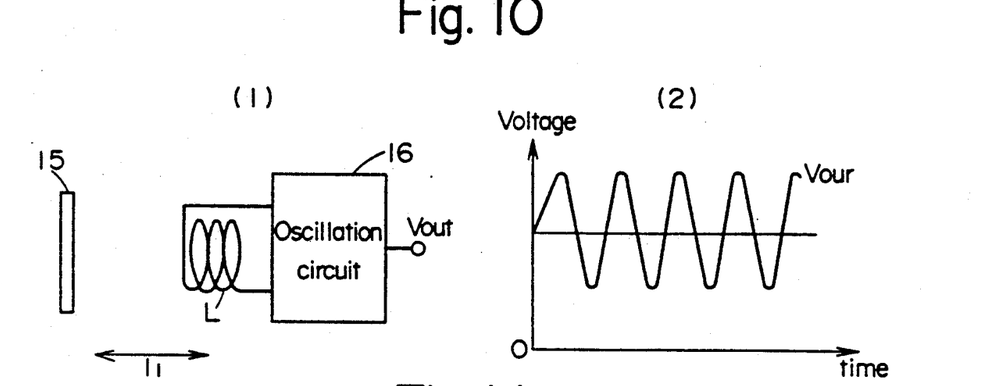
FIG. 10 illustrates the output of an induction type sensor when metal is away.
Figure 11:
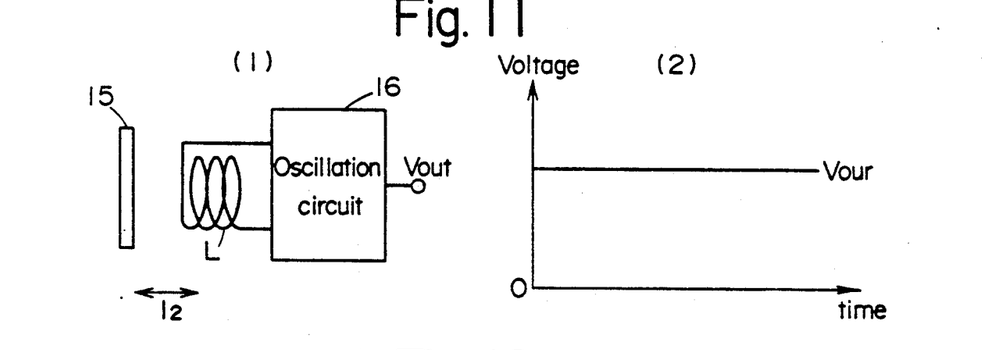
FIG. 11 illustrates the output of an induction type sensor when metal is near.

FIGS. 10 and 11 show the principle of a sensor. When a metal piece 15 is far away (at a distance 11) from the coil L, an oscillation circuit's 16 output (V out) oscillates. However, when the metal 15 approaches (to a distance 12), the oscillation circuit's 16 output (V out) no longer oscillates because the metal 15 is subjected to magnetic flux from the coil L. Consequently, the metal 15 produces an eddy current due to electron conduction. The electron conduction increases resistance in the oscillation coil L and oscillation stops, as shown in FIG. 11 (2).

Figure 12:
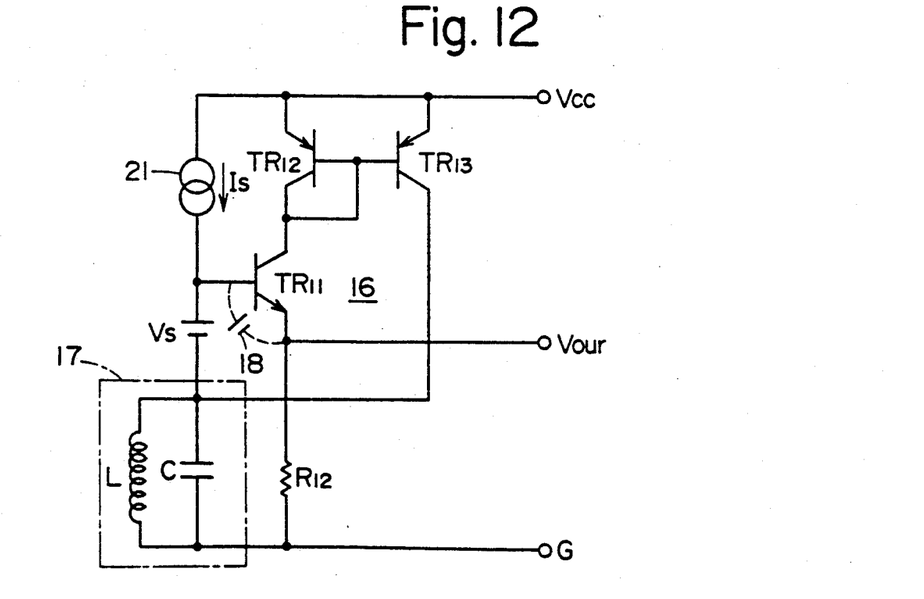
FIG. 12 shows a Hartly type oscillation circuit.

FIG. 12 shows a Hartly type oscillation circuit used as the oscillation circuit 16 in FIG. 11. This oscillation circuit 16 comprises a transistor TR11 for amplification, an LC resonant circuit 17, and resistor R12. The operation point of transistor TR11 is determined by arranging a constant current source 21 and bias voltage Vs. Transistors TR12 and TR13 comprise a mirror circuit. The collector circuit of TR13, which has the same bias as the collector current of TR11, is fed back to the LC resonant circuit 17. Additionally, power source voltage is Vcc, output of the oscillation circuit is Vout, and G is the ground.

Figure 13:
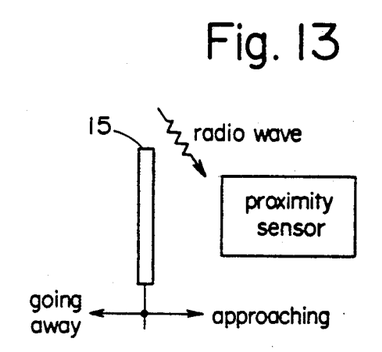
FIG. 13 shows a state of radio wave arrival while a metal body approaches or goes away from a sensor.
Figure 14:
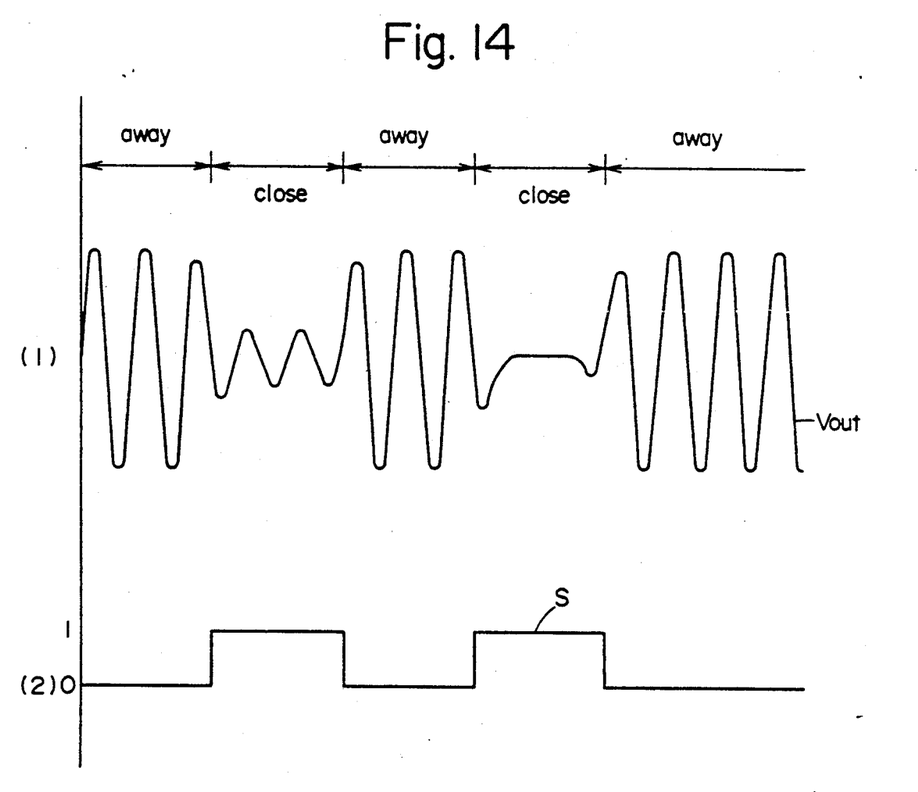
FIG. 14 shows an output wave chart of a sensor.

As shown in FIG. 13, a metal body 15 is approaching or going away from the sensor containing the abovementioned oscillation circuit 16. The output signal Vout, shown in FIG. 14, changes with respect to metal's proximity to the sensor. FIG. 14 (1) shows the oscillation coil output while FIG. 14 (2) represents binarization of the coil's output. The Vout is binarized according to a predetermined threshold level; binary signal S corresponds to the periods of reduced oscillation from the coil that occur when metal is in close proximity to the sensor, i.e. when the pachinko ball 14 goes through the detection hole 13.

Figure 15:
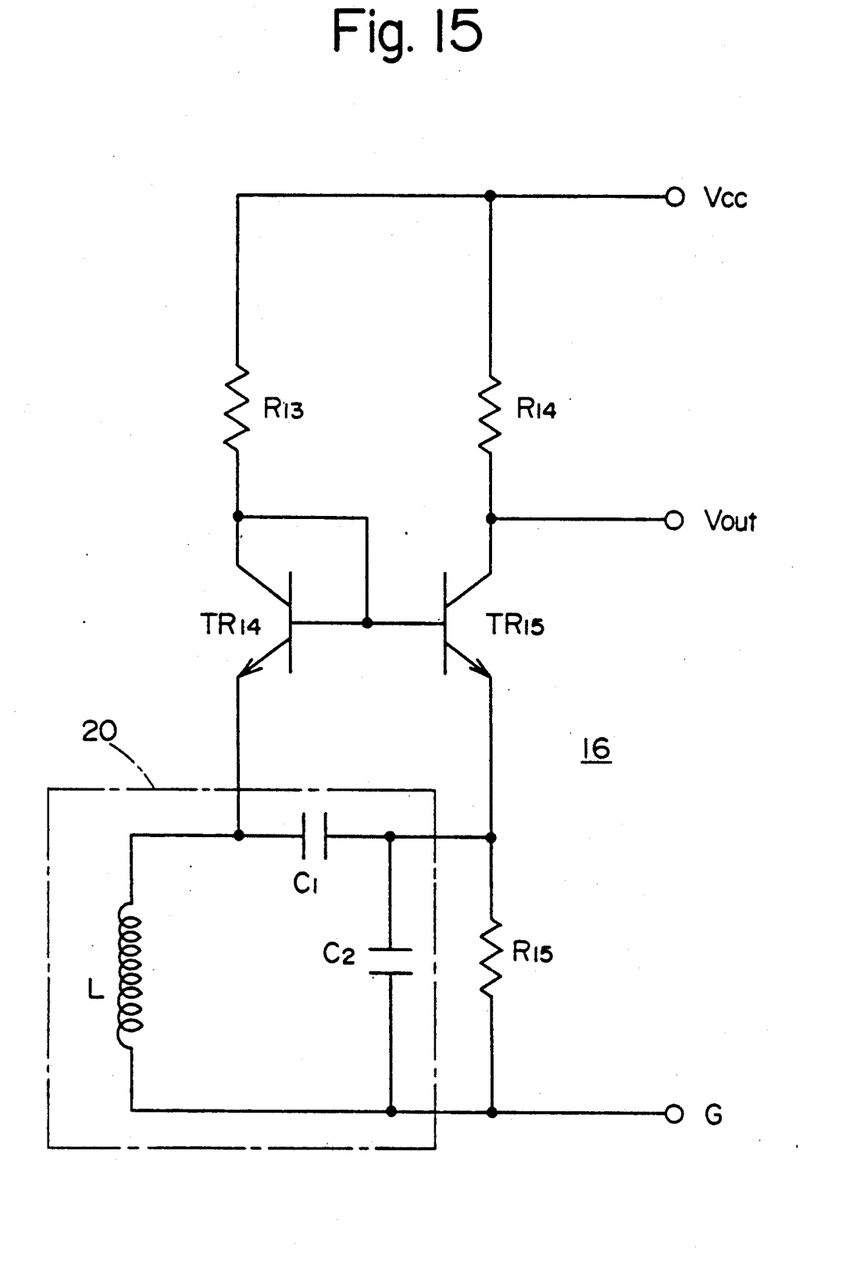
FIG. 15 illustrates a Corbitt type oscillation circuit.

In addition to the Hartly type oscillation circuit, a Corbitt type oscillation circuit, as shown in FIG. 15, may be used to detect pachinko balls. In a Corbitt type oscillation circuit, a pair of capacitors C1 and C2 and oscillation coil L comprise LC resonant circuit 20. Additionally, LC resonant circuit 20 and a plurality of resistors R13, R14, R15 are electronically connected to a pair of transistors T14, T15.

SUMMARY

The problem with conventional sensors is that some people are able to intentionally deceive the sensors to falsely indicate proximity of metal. Thus, such people can unlawfully cause a machine to indicate pachinko ball passage into a prize hole and reap the benefits accorded to such passage. Specifically, some people illegally direct a transceiver emitting radio waves toward the sensor located in the prize hole to generate a detection signal even when no ball goes through the hole. Such transceivers are small and thus easily concealed from pachinko parlor personnel, presenting a problem of reduced revenue for the parlor.

Referring to FIG. 12, this intentionally caused malfunction seems to be caused by internal capacitance circuit 18 oscillation. More specifically, a radio wave induced from oscillation coil L to oscillation circuit 16 reaches a base of transistor TR11 and decreases a difference of voltage from ends of internal capacitance 18. Consequently, sufficient voltage is not applied between base and emitter and transistor TR11 is shut off. When the transistor TR11 is shut off, the detection signal S is generated and the pachinko machine will mistakenly dispense winnings.

Accordingly, this invention has a primary object of preventing the occurrence of a malfunction caused by a radio wave by having a function detecting an existence of such a radio wave being directed towards the oscillation coil of the sensor.

Therefore, a sensor according to this invention comprises an oscillation circuit including an LC resonant circuit as a detector circuit, wherein the sensor features a radio wave detection circuit which produces a prohibition signal when it detects the presence of radio waves. When an object to be detected is far away, the oscillation circuit's output oscillates. When the object is near, oscillation stops and the detection circuit produces a detection signal S. However, if radio waves are directed towards the sensor, the radio wave detection circuit detects such waves and produces a prohibition signal so that any detection signal produced is ignored.

Other objects and advantages of this invention will become apparent from the following description and accompanying drawings.

DESCRIPTION OF THE PREFERRED EMBODIMENTS

Figure 1:
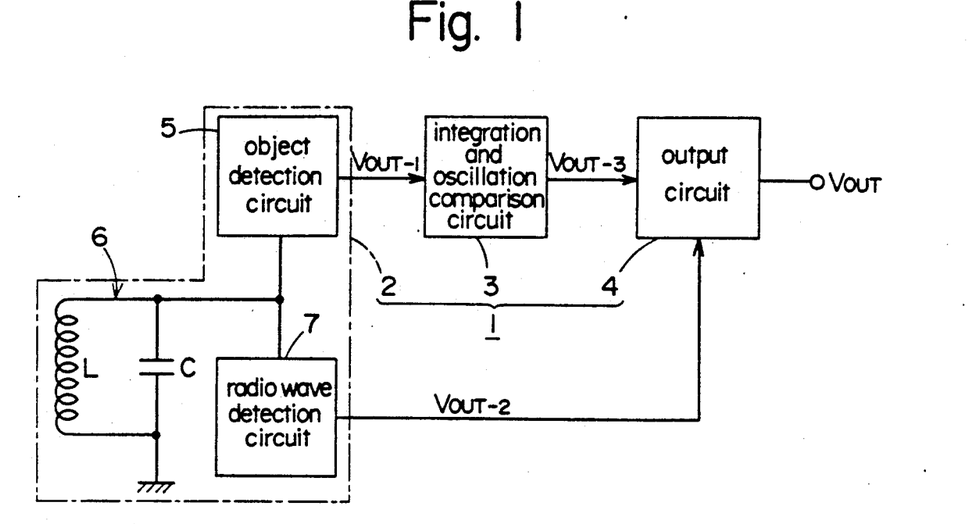
FIG. 1 shows a block diagram illustrating a detection circuit of a sensor according to this invention.

FIG. 1 shows a detection circuit of a pachinko ball sensor according to this invention. However, this invention shall be applied to other fields and is not restricted to this application, namely that of a pachinko ball sensor. Moreover, since the appearance of the sensor according to this invention is the same as that of FIG. 9, additional drawings and explanations are omitted. The detection circuit 1 shown in FIG. 1 comprises an oscillation circuit 2 and an integration and oscillation comparison circuit 3 and an output circuit 4, wherein the above circuits are electrically connected to each other. The oscillation circuit 2 includes a radio wave detection circuit 7 in addition to a conventional object detection circuit 5. As previously described, the oscillation circuit ceases to oscillate when the pachinko ball passes through the detection hole 13.

Figure 2:
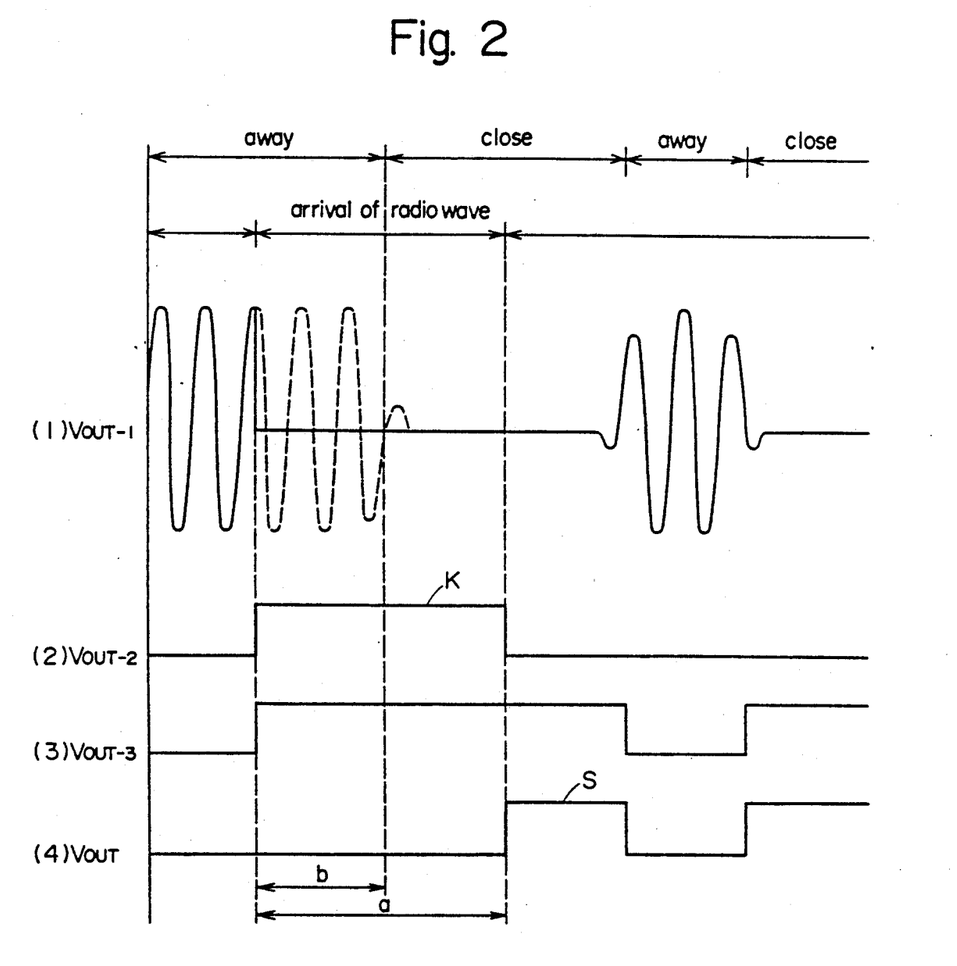
FIG. 2 shows a time chart illustrating an operation of the detection circuit in FIG. 1.

FIG. 2 (1) shows an oscillation wave Vout-1 corresponding to the proximity of metal to the object detector circuit 5. The radio wave detector circuit 7 binarized output, shown in FIG. 2 (2), is a prohibition signal K which is produced upon detection of radio waves. As can be seen in FIG. 2 (3, 4), when oscillation ceases due to emitted radio waves, no detection signal S is produced because such a signal is prohibited by prohibition signal K (case b). Furthermore, even if the pachinko ball goes through detection hole 13 when radio waves are directed to the sensor, prohibition signal K precludes the detection signal from being produced (case a). Accordingly, detection signal S is only produced when the ball passes through the detection hole 13 while no radio waves are being directed to the apparatus. Consequently, pachinko machines incorporating the induction type sensor of this invention will no longer be fooled and cheated by people using a transceiver to emit radio waves.

Figure 3:
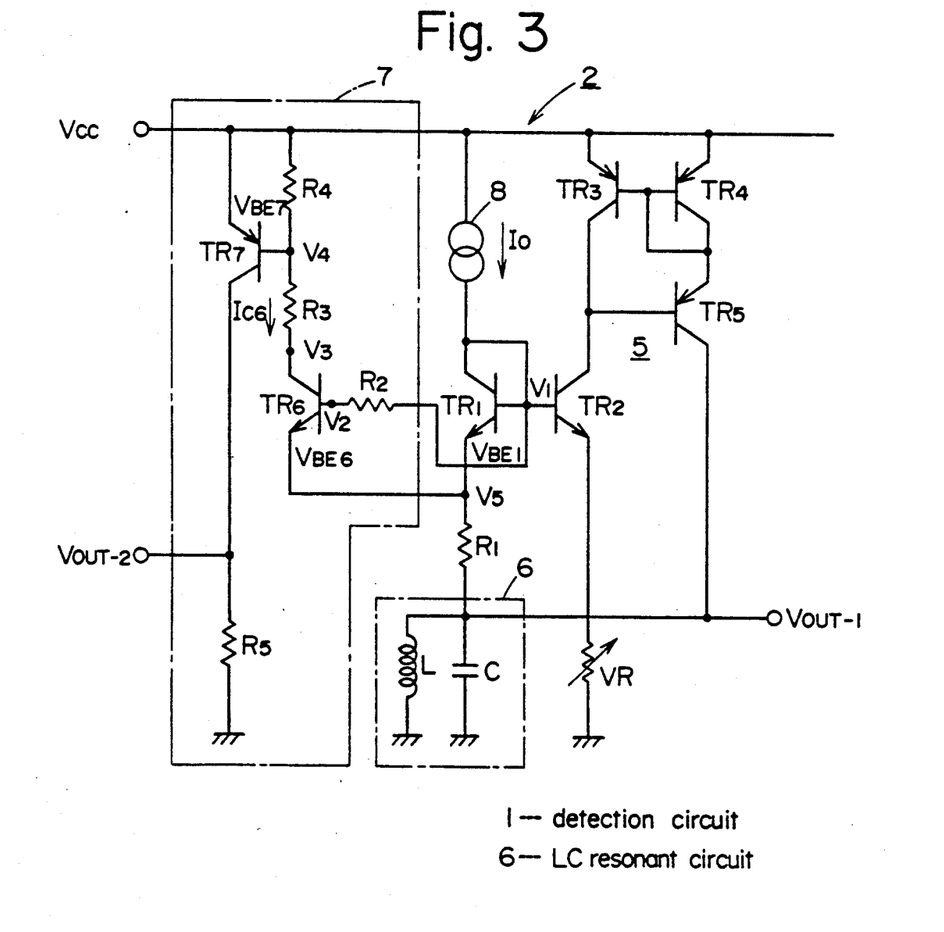
FIG. 3 shows an embodiment of an oscillation circuit using a Hartly type circuit.

FIG. 3 shows an embodiment of oscillation circuit 2 using a Hartly type circuit, wherein object detection circuit 5 and radio wave detection circuit 7 are included therein. The object detector circuit 5 comprises transistors for amplification TR1, TR2, LC resonant circuit 6, resistor R1, and adjustable resistor VR, wherein amplification transistor TR1 has its base and collector short-circuited. A constant current source 8 supplies amplification transistors TR1, TR2 with bias voltage. Transistors TR3,TR4,TR5 constitute a feedback circuit. More specifically, transistors TR3, TR4 constitute a mirror circuit which feeds back the same current to the LC resonant circuit 6 as the collector current fed back from the transistor TR2.

The radio wave detection circuit 7 comprises a pair of transistors TR6, TR7 and a plurality of resistors R2, R3, R4, R5, wherein the base of transistor TR6 is connected through resistor R2 to the base of transistor TR1 of the object detection circuit 5. Furthermore, the transistor TR6 is an active circuit. The voltage between the base and emitter of transistor TR1 is equal to the voltage between the base and the emitter of TR6 plus the voltage of both ends of the resistor R2, as shown by the equation: Vbe1=Vbe6+Vr2.

The relationship between constant current Io of transistor TR1 and constant current Ic6 of transistor TR6 is such that Io is much larger than Ic6 (Io>>Ic6) during periods of normal operation. Accordingly, a comparison of the two transistors' TR1, TR6 operation points shows that the operation point of transistor TR6 is closer to the shut off domain. As a result, when voltage Vbe1 of transistor TR1 drops for some reason, transistor TR6 will shut off before transistor TR1 shuts off.

Figure 6A:
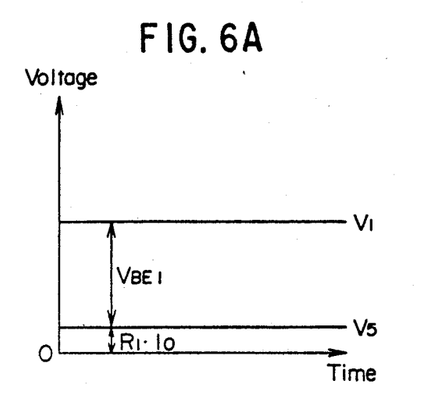
FIGS. 6A and 6B show voltage waves of parts of the oscillation circuit.
Figure 6B:
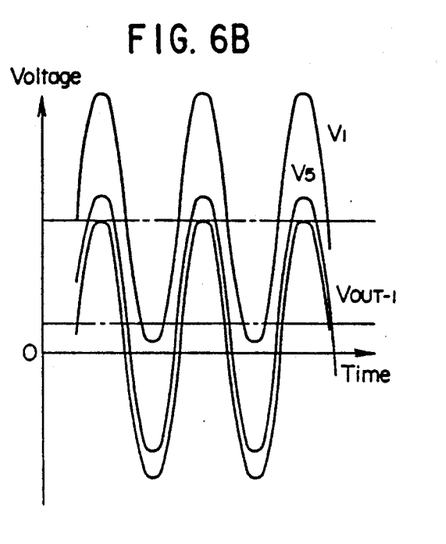

FIGS. 6A and 6B show the respective voltages V1, V5 between the base and emitter of transistor TR1 and the output voltage Vout of the object detector circuit 5. FIG. 6A shows a voltage wave produced when the oscillation operation ceases due to an approach of a metal object. FIG. 6B shows the oscillating voltage wave that occurs when no metal object is in close proximity to the sensor. According to FIG. 6B the base voltage V1 of transistor TR1 is the center line, wherein the voltage represents the equation: (R1×Io)+Vbe1. The potential voltage Vbe1 is oscillating around center voltage R1×Io. The output Vout-1 is around zero volts; each voltage oscillates around one of the three center lines.

Transistor TR6 of the radio wave detection circuit 7 has voltages Vb1 and Vb5 applied thereto so that its voltage Vbe6 stays constant and its connector current Ic also theoretically stays constant (actually, a slight oscillation impulse current appears). As a result, the voltage difference between both ends of resistor R4 is represented as R4×Ic6. If R4×Ic6 is greater than 0.6 volts (for example, around 1 volt), then transistor TR7 stays on whether the object detection circuit 5 is oscillating or not.

Figure 7A:
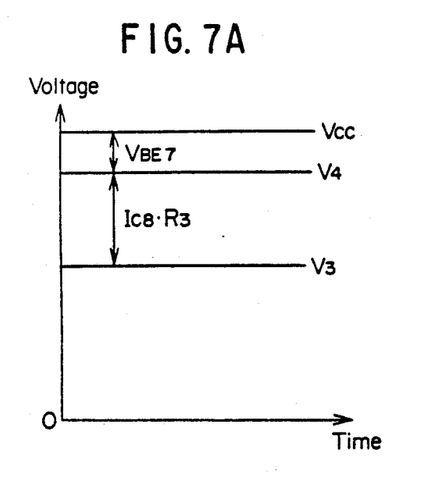
FIGS. 7A and 7B show voltage waves of parts of the oscillation circuit.
Figure 7B:
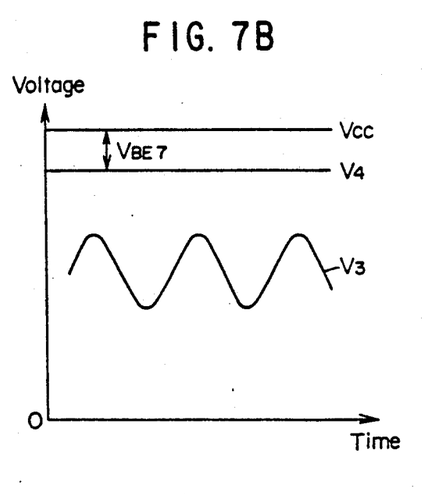

FIGS. 7A and 7B show base voltage V4 of transistor TR7 and collector voltage V3 of transistor TR6 respectively. FIG. 7A shows the voltage wave in the case of oscillation termination while FIG. 7B shows the voltage wave in the case of oscillation. According to FIG. 7B collector voltage V3 of transistor TR6 has a slight oscillation.

Figure 4:
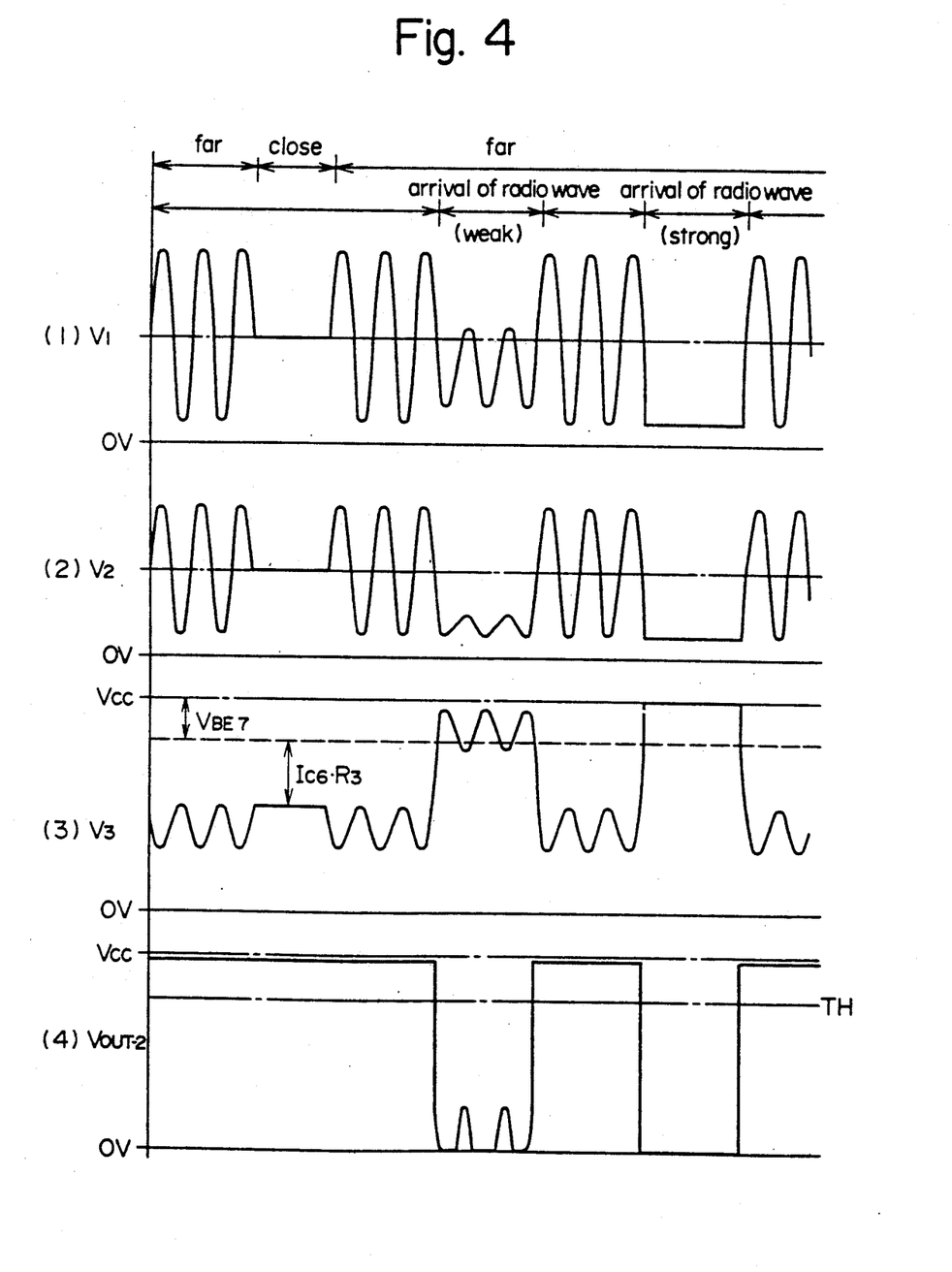
FIG. 4 shows a time chart illustrating an operation of the oscillation circuit of FIG. 3.

The operation of the oscillation circuit 2 will now be described, referring to FIG. 4. A metal, for example, a pachinko ball, is away from the oscillation coil L. The oscillation circuit 2 initiates oscillation and each part of the circuit has a voltage level shown in FIG. 4 (1) (2) (3). FIG. 4 (1) shows the base voltage V1 of transistor TR1 of the object detection circuit 5. FIG. 4 (2) shows the base voltage V2 of transistor TR6 of the radio wave detector 7. FIG. 4 (3) shows the collector voltage V3 of transistor TR6.

Output Vout-1 of the object detector 5 is shown in FIG. 2 (1). Outputs Vout-3 and Vout-4 of the integration and oscillation comparison circuit 3 and the output circuit 4 are shown in FIG. 2 (3) and FIG. 2 (4) respectively. Output Vout-2 of the radio wave detection circuit 7 is shown in FIG. 4 (4) wherein transistor TR7 is in an ON state. Output Vout-2 of the radio wave detection circuit 7 is input to a comparator (not shown) and compared with a standard reference value TH, producing the output Vout-2 shown in FIG. 2 (2).

Operation of the apparatus will now be described. When a metal object approaches the oscillation coil L, the oscillation circuit 2 ceases its oscillation operation. Each part of the circuit has a voltage as shown in FIG. 4 (2) (3). Accordingly, the oscillation waves disappear. As a result, output Vout-3 of the integration and oscillation comparison circuit 3 drops as shown in FIG. 2 (3). However, output Vout-2 of the radio wave detection circuit 7 will not change as shown in FIG. 4 (4) because transistor TR7 is still ON.

Figure 5:
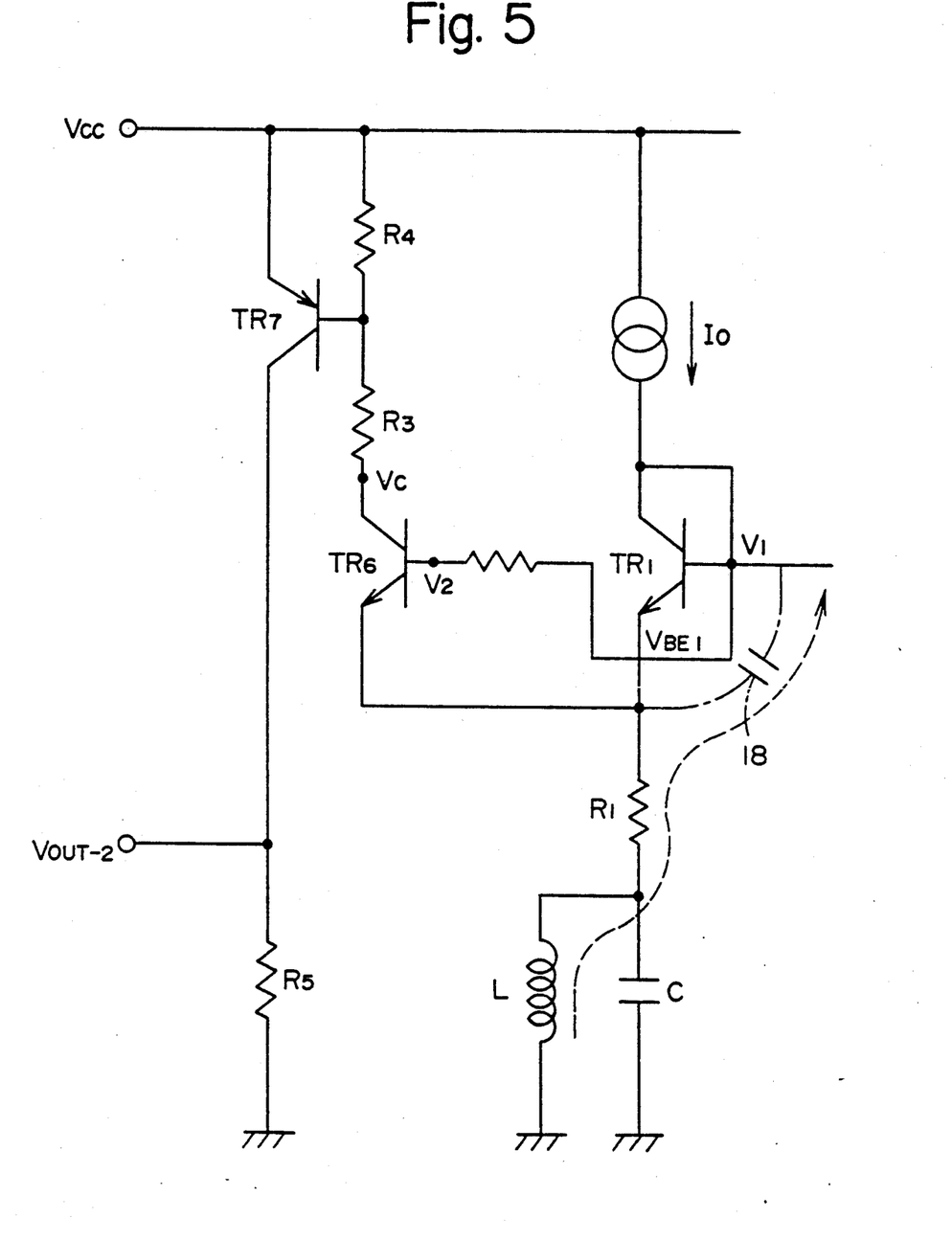
FIG. 5 shows an electronic circuit illustrating the flow of a radio wave through the circuit.

When a radio wave is directed towards the apparatus, it comes in from the oscillation coil L to the oscillation circuit 2, arriving at the base of transistor TR1 through the internal capacitance 18 of transistor TR1 (as shown by the broken line in FIG. 5). Both ends of internal capacitance 18 drop and the base-emitter voltage Vbe1 of transistor TR1 becomes small, turning transistor TR1 off. As a result, base voltages V1 and V2 of transistors TR1 and TR6 drop as shown in FIG. 4 (1) (2). Output Vout-1 of the object detection circuit 5 is shown in FIG. 2 (1) wherein the output Vout-2 of the integration and oscillation comparison circuit 3 is raised. However, the operating point of transistor TR6 of the radio wave detection circuit 7 is set to be closer to the shut off domain as compared to transistor TR1 of the object detection circuit 5. Accordingly, transistor TR6 shuts off before transistor TR1. As a result, current Ic6 of transistor TR6 becomes small and collector voltage V3 is raised as shown in FIG. 4 (3). Furthermore, base emitter voltage Vbe7 becomes small and transistor TR7 turns off and output Vout-2 of the radio wave detection circuit 7 drops as low as 0 volts as shown in FIG. 4 (4). In this way, the output Vout-2 drops below the reference value TH of the comparator. Output Vout-2 is raised, as shown in FIG. 2 (2), producing prohibition signal K. Thus, output circuit 4 regulates the passing of output Vout-3 of the integration and oscillation comparison circuit 3, based on the arrival of a radio wave, detected by the means of the prohibition signal K.

Figure 8:
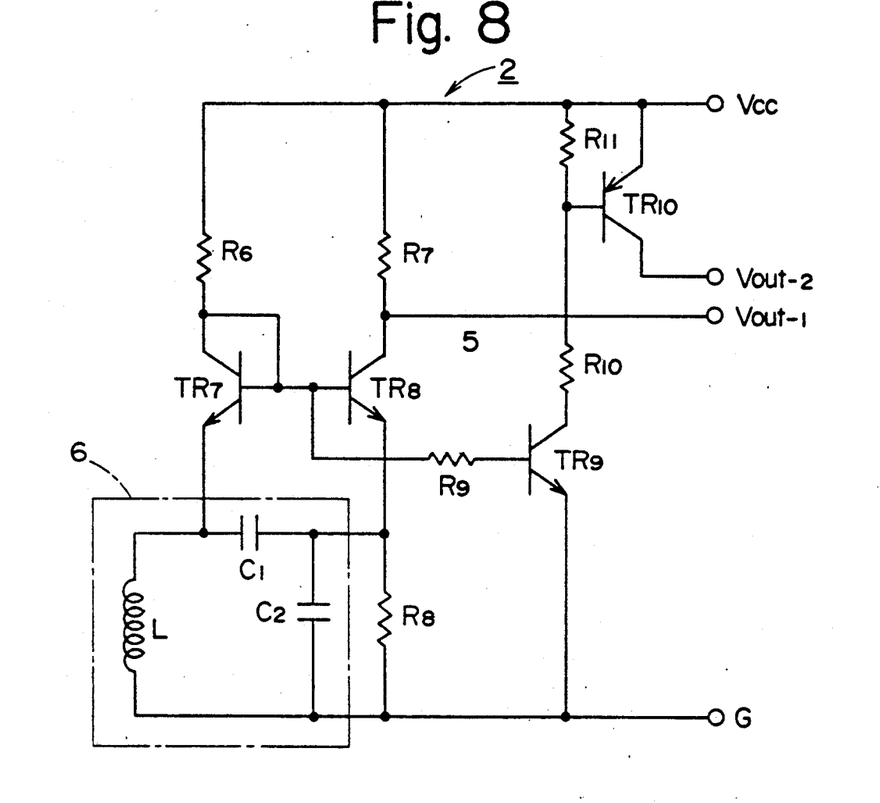
FIG. 8 shows another embodiment of the oscillation circuit, employing a Corbitt type circuit.

The above embodiment employs a Hartly type oscillation circuit 2. However, a Corbitt type could be used, as shown in FIG. 8. The Corbitt type oscillation circuit 2 includes an oscillation coil L, an LC resonant circuit 6, and a pair of capacitors C1 C2, wherein resistors R6 R7 R8 of the LC resonant circuit 6 are connected to transistors TR7 TR8, constituting an object detection circuit 5. The base of transistor TR8 is connected to transistor TR9 through resistor R9. Further, transistor TR9 is connected to transistor TR10 through resistors R10 R11, constituting a radio wave detection circuit 7. Finally, the oscillation circuit 2 of FIG. 8 has a function of object detection and radio wave detection similar to that of the Hartly circuit. Accordingly, specific explanation of the operation is omitted.

Figure 16:
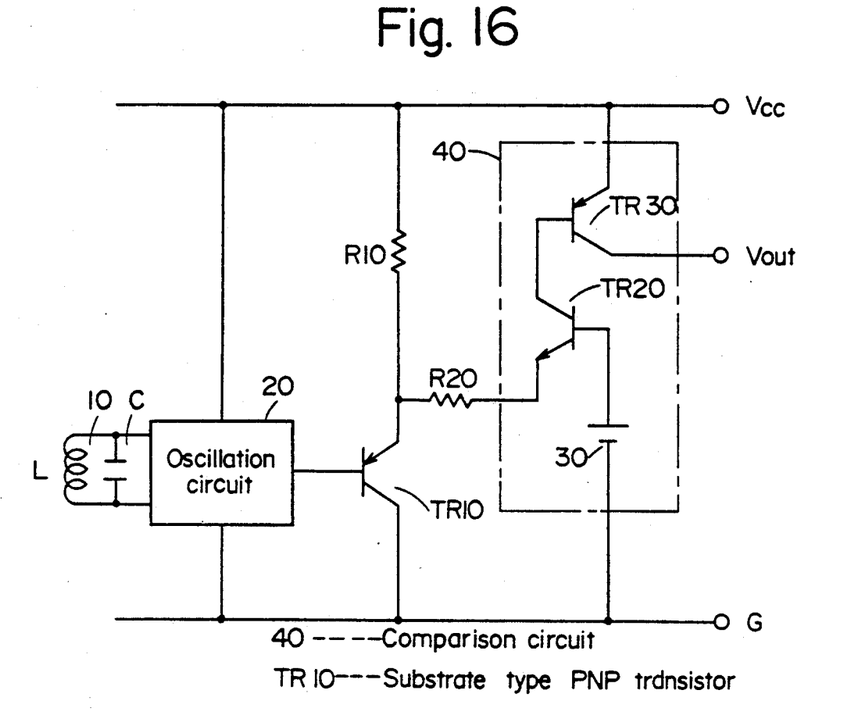
FIG. 16 is a block diagram illustrating another embodiment of this invention.

FIG. 16 shows a block diagram illustrating another embodiment of sensor according to this invention. The sensor has an oscillatin circuit 20 connected to an LC resonant circuit 10. LC resonant circuit 10 has a detection coil L disclosed close to a detection position of a metal ball. The oscillation circuit 20, e.g. a Hartly type, is supplied with voltage and oscillates during periods of normal operation, i.e. when no metal is present. An oscillation output signal is fed to a substrate type PNP transistor TR10. The substrate type PNP transistor TR10 has a collector in common with a substrate and is connected to the ground. Furthermore, the transistor TR10 constitutes an emitter follower circuit. The emitter of transistor TR10 is connected to a power supply Vcc through a resistor R10 and to an emitter of a NPN type transistor TR20 through resistor R20. The base of transistor TR20 has a constant voltage Vo, e.g. 2.8 volts supplied from voltage source 30, connected thereto. The collector of transistor TR20 is connected to the base of a PNP type transistor TR30. The emitter and collector of transistor TR30 are connected to the power supply Vcc and an output terminal Vout respectively. Transistors TR20 TR30 constitute a comparison circuit 40, wherein the constant voltage Vo serves as a threshold level. The structure of an integrated circuit using a substrate type PNP transistor TR10 will be described hereinafter.

Figure 17:
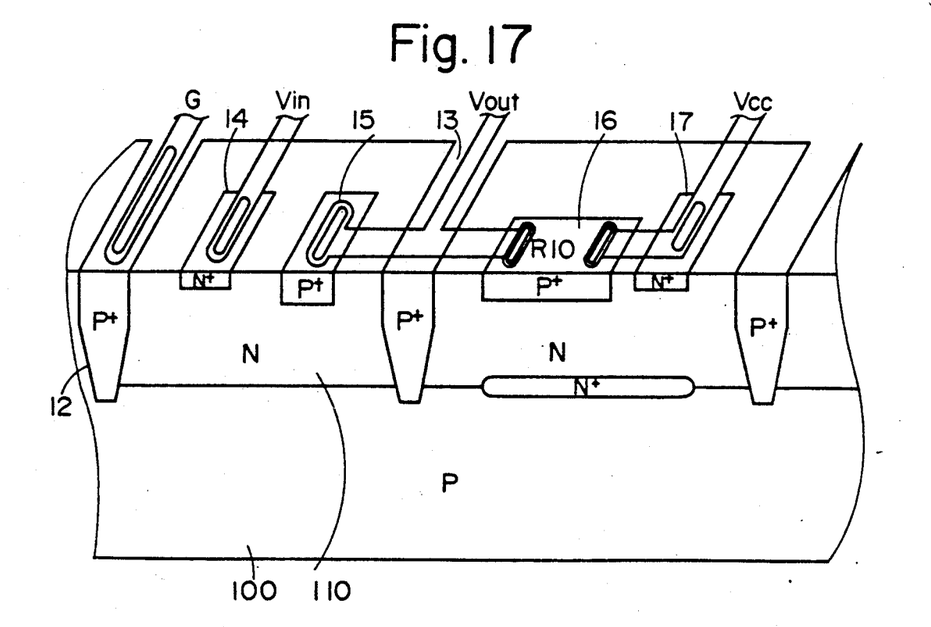
FIG. 17 shows a transistor TR10 and emitter resistor R10 of FIG. 16.

FIG. 17 shows transistor TR10 and its emitter resistor R10. A substrate of the integrated circuit comprises a P layer 100. N layer 110 is formed over the P layer 100. In P layer 100 there are provided P+ domains 12 13 protruding towards the top. Mutual electrodes are provided thereupon and are connected to the ground and output terminal Vout respectively.

In N layer 110, N+ domain 14 and P+ domain 15 are closely provided as a base and emitter respectively, constituting the substrate type PNP transistor TR10. Furthermore, in N domain 11, P+ domain 16 is formed as resistor R10. Resistor R10 is connected to P+ domain 15 by means of a metal body. P+ domain 16, constituting resistor R10, is connected to the power supply Vcc through N+ layer 17.

Figure 18:
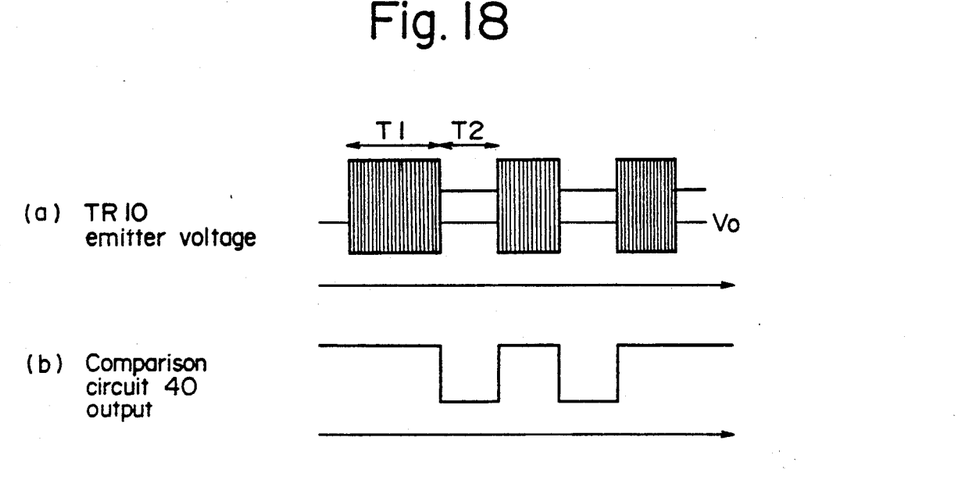
FIG. 18 shows emitter voltage of transistor TR10 and corresponding output signals of a comparison circuit 40 at times T1 and T2 which represent ball proximity and non-existence respectively.

Operation of the sensor depicted in FIGS. 16 17 will now be described. FIG. 18 (a) (b) shows output signals of comparison circuit 40 and emitter voltage of transistor TR10 wherein a metal ball is either in close proximity to or away from the oscillation coil L. The metal ball is away from the coil L at time T1, wherein the oscillating circuit 20 maintains oscillation at a constant frequency. The emitter of transistor TR1 provides an amplitude wave shown in FIG. 18 (a). In this state, transistor TR10 turns on and off repeatedly. Accordingly, a signal dropping below the threshold voltage value Vo is supplied to transistor TR20. Thus, at time T1, transistor TR20 also repeatedly turns on and off. As a result, as shown in FIG. 18 (b), transistor TR30 turns on, voltage output Vout is high, and the absence of metal is detected. On the other hand, when a metal ball passes closely to the coil L at time T2, the oscillation circuit 20 ceases oscillation, as shown in FIG. 18 (a). At this time T2 the emitter of transistor TR20 surpasses the threshold voltage value Vo, transistors TR20 TR30 turn off, and the voltage output Vout drops, indicating the proximity of metal.

Figure 19:
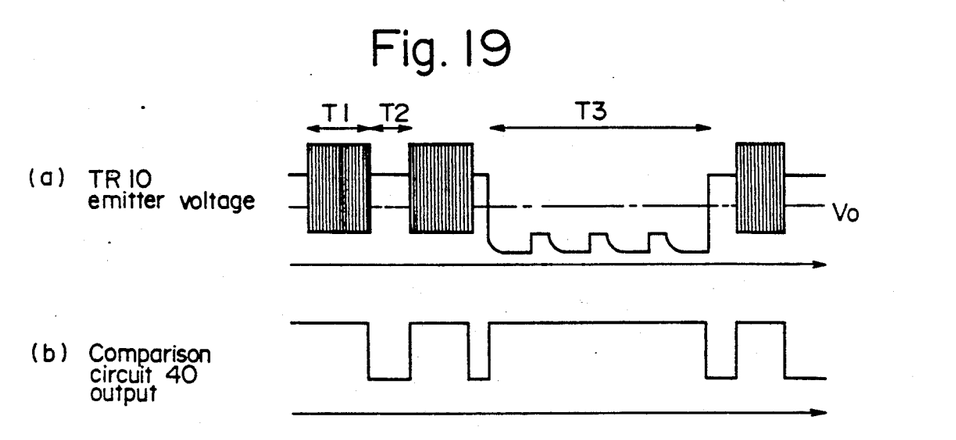
FIG. 19 shows emitter voltage of transistor TR10 and corresponding output signals of comparison circuit 40 at a time T3 in which radio waves are being directed to an oscillation coil L.

As shown in FIG. 19, an intense radio wave, e.g. 430 mh (40 watts), is directed towards the coil L in the oscillation circuit 20 at time T3. At this time, PNP transistor TR10 turns on and the emitter voltage falls to almost zero volts. This happens because the substrate serves as a kind of antenna, losing a function as a transistor. As shown in FIG. 19 (b), transistors TR20 TR30 also turn on during time T3. At time T3, the output of transistor TR20 goes down and the output of transistor TR30 goes up, indicating the absence of metal. Therefore, when a radio wave is directed to the coil L, an output showing no metal ball is produced irrespective of a ball's presence. When radio wave emission ceases, the apparatus returns to normal operation.

Figure 20:
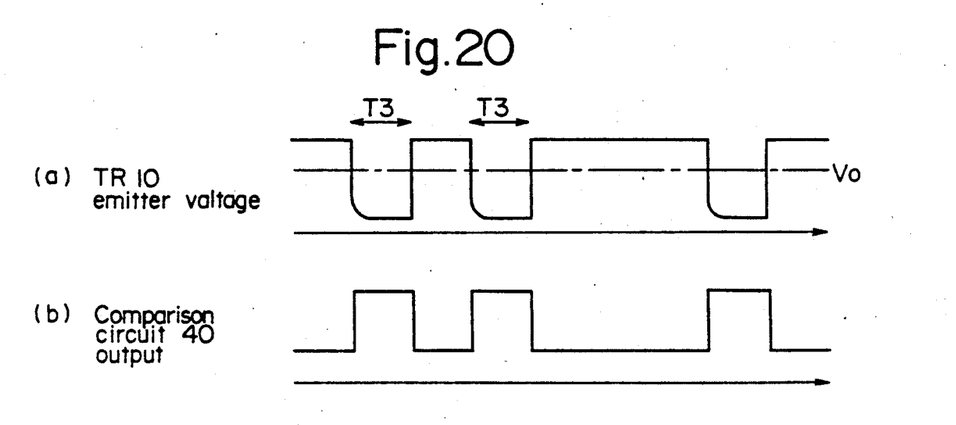
FIG. 20 shows signal waves corresponding to times wherein a ball is in proximity to the oscillation coil L and radio waves are emitted or not emitted to the coil L.

FIG. 20 shows a signal wave wherein metal is in close proximity to the coil L and a radio wave is alternatingly being directed at the apparatus. When the radio wave is not emitted towards the coil L, transistors TR10 TR20 TR30 are all turned off and metal ball presence is detected. On the other hand, when a radio wave is emitted, the emitter voltage of transistor TR10 drops to around zero volts and transistors TR10 TR20 TR30 all turn on, producing a signal corresponding to metal ball absence. In this description, the radio wave is emitted at 430 mh (40 watts). However, the embodiment is not limited by this figure as the effect can be obtained for signals ranging from 10 to 1000 mh.

The above descriptions and accompanying drawings are merely illustrative of the applications of the principles of the present invention and are not limiting. Many other embodiments falling under the spirit and scope of this invention may be devised by those skilled in the art. Accordingly, this invention is only limited by the scope of the appended claims.

What is claimed is:

1. A sensor, comprising:
   an oscillation circuit including an LC resonant circuit as an object detection circuit; and
   a means for prohibiting a detection signal upon arrival of an external radio wave.

2. A sensor according to claim 1, wherein a radio wave detection circuit is provided in said oscillation circuit, producing a prohibition signal responsive to an arrival of a radio wave.

3. A sensor according to claim 2, further comprising an integration and oscillation comparison circuit and an output circuit, wherein the output circuit produces a detection signal only when metal is detected by the object detection circuit and no radio waves are detected by the radio wave detection circuit.

4. A sensor according to claim 3, wherein the object detection circuit comprises first and second transistors for amplification, the LC resonant circuit, a resistor, and an adjustable resistor, wherein the first transistor for amplification has its base and collector short-circuited.

5. A sensor according to claim 4, wherein the radio wave detection circuit comprises third and fourth transistors and a plurality of resistors, wherein the base of the third transistor is connected through a resistor to the base of the first transistor.

6. A sensor according to claim 5, wherein the voltage between the base and emitter of the first transistor is equal to the voltage between the base and emitter of the third transistor plus the voltage across the resistor connected therebetween.

7. A sensor according to claim 6, wherein constant current of the first transistor is much larger than constant current of the third transistor during periods of normal operation.

8. A sensor according to claim 1, further comprising a comparison circuit for detecting a cessation of oscillation output, wherein said means for prohibiting a detection signal upon arrival of an external radio wave comprises an emitter follower circuit of a substrate type PNP transistor, wherein an output of said oscillation circuit is supplied to the transistor's base, the transistor's collector is formed as a substrate, and the transistor's emitter is connected to a power supply through an emitter resistor; and wherein said oscillation circuit output is read to said comparison circuit through said emitter follower circuit.

9. A sensor according to claim 8, wherein oscillation of said oscillation circuit indicates absence of metal and a cessation of oscillation indicates proximity of metal.

10. A sensor according to claim 9, wherein when a radio wave is emitted at the apparatus, the substrate type PNP transistor turns on because the substrate acts as an antenna, losing its function as a transistor.

11. A sensor according to claim 10, wherein proximity of metal can only be indicated when no radio wave is emitted at the apparatus.

* * * * *